United States Patent [19]
Merchant et al.

[11] Patent Number: 6,130,150
[45] Date of Patent: Oct. 10, 2000

[54] METHOD OF MAKING A SEMICONDUCTOR DEVICE WITH BARRIER AND CONDUCTOR PROTECTION

[75] Inventors: Sailesh Mansinh Merchant; Sudhanshu Misra; Pradip Kumar Roy, all of Orlando, Fla.

[73] Assignee: Lucent Technologies, Inc., Murray Hill, N.J.

[21] Appl. No.: 09/370,523

[22] Filed: Aug. 6, 1999

[51] Int. Cl.[7] ................................................ H01L 21/4763
[52] U.S. Cl. ........................ 438/618; 438/584; 438/597
[58] Field of Search .................................. 438/618, 597, 438/584

[56] References Cited

U.S. PATENT DOCUMENTS 5,869,393  2/1999  Tseng .
5,897,369  4/1999  Jun .

*Primary Examiner*—Kevin M. Picardat
*Assistant Examiner*—D. M. Collins
*Attorney, Agent, or Firm*—Allen, Dyer, Doppelt, Milbrath & Gilchrist, P.A.

[57] ABSTRACT

A method of making a semiconductor device includes forming at least one opening, having vertical sidewalls and a bottom, in a first dielectric layer adjacent a substrate. A second dielectric layer is formed to line the vertical sidewalls of the at least one opening, and has a relatively lower etch rate than the first dielectric layer. A conductive layer is deposited to fill the at least one opening and an upper surface of the semiconductor wafer is cleaned. The method preferably includes the steps of depositing a barrier layer lining the second dielectric layer and the bottom of the at least one opening, and chemically mechanically polishing the semiconductor wafer with the second dielectric layer protecting upper edges of the barrier layer and conductive layer. Preferably, the relatively lower etch rate of the second dielectric layer is a relatively lower wet etch rate based on a wet etch in hydrofluoric acid and the step of cleaning the upper surface of the semiconductor wafer comprises a wet etch in hydrofluoric acid. Thus, the conductive layer and the barrier layer are protected from a cleaning wet etch which may include the use of hydrofluoric acid. Localized corrosion of the conductive layer, which may be copper, is prevented.

25 Claims, 4 Drawing Sheets

METHOD OF MAKING A SEMICONDUCTOR DEVICE WITH BARRIER AND CONDUCTOR PROTECTION

FIELD OF THE INVENTION

This invention relates to the field of semiconductor manufacturing, and, more particularly, to the field of semiconductor interconnects.

BACKGROUND OF THE INVENTION

In the manufacture of semiconductor wafers and integrated circuits, metal films are deposited on semiconductor substrates, oxides and other dielectrics. These metal films are used for different purposes, such as forming interconnect lines, metallic contacts, conductive vias and other conductive features on and above various surfaces of the semiconductor wafers.

Typically, aluminum has been a preferred conductive metal because it avoids various problems, such as a high contact resistance with silicon, which normally accompanies the use of gold and copper. Copper also suffers drawbacks compared to aluminum because copper migrates into device areas, causing problems in device performance. Aluminum, on the other hand, has good adhesion to silicon dioxide and performs well with plasma etching, as compared to copper.

Recently, greater interest has been shown by manufacturers of semiconductor devices in the use of copper and copper alloys for metallization patterns, such as in conductive vias and interconnects. Copper, compared to aluminum, has both good electromigration resistance and a relatively low electrical resistivity of about 1.7 $\mu$ohm·cm. Unfortunately, copper is relatively quick to oxidize and/or corrode especially during processing or manufacturing of the integrated circuit. For example, after chemical mechanical polishing (CMP), localized corrosion of the copper conductor may occur when hydrofluoric acid (HF) attacks the barrier layer and copper conductor. HF is typically used in the cleaning step for removal of copper and slurry particulates from the oxide/dielectric surface by chemical etching.

SUMMARY OF THE INVENTION

It is therefore an object of the present invention to provide a method of making a semiconductor device including a conductor while avoiding localized conductor corrosion during processing, for example.

This and other objects, features and advantages in accordance with the present invention are provided by a method of making a semiconductor device including the steps of: forming a semiconductor wafer including a first dielectric layer, having at least one opening therein, adjacent a semiconductor substrate, the at least one opening having vertical sidewalls and a bottom; forming a second dielectric layer lining the vertical sidewalls of the at least one opening, the second dielectric layer having a relatively lower etch rate than the first dielectric layer; depositing a conductive layer filling the at least one opening; and cleaning an upper surface of the semiconductor wafer with the second dielectric layer protecting upper edges of the barrier layer and conductive layer. The method preferably includes the steps of depositing a barrier layer lining the second dielectric layer and the bottom of the at least one opening, and chemically mechanically polishing the semiconductor wafer.

The first dielectric layer may be formed of silicon oxide while the second dielectric layer may be formed of at least one of silicon nitride, silicon oxynitride, silicon-rich-oxide, and high density silicon oxide. Also, the conductive layer may be copper and the barrier layer may be a refractory metal.

Preferably, the relatively lower etch rate of the second dielectric layer is a relatively lower wet etch rate based on a wet etch in hydrofluoric acid and the step of cleaning the upper surface of the semiconductor wafer comprises a wet etch in hydrofluoric acid. The second dielectric layer may have a thickness in the range of 20–150 nanometers (nm).

Thus, during the manufacture of such a semiconductor device, the conductive layer and the barrier layer are protected from a cleaning wet etch which may include the use of hydrofluoric acid. The likelihood of localized corrosion of the conductive layer, which may be copper, is greatly reduced.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. The dimensions of layers and regions may be exaggerated in the figures for clarity.

Figure 1:
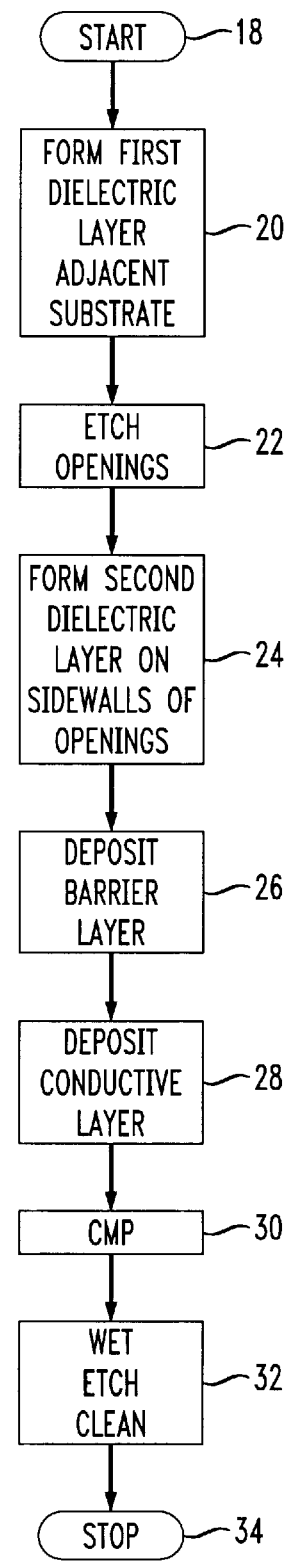
FIG. 1 is a flow chart showing the steps for making the semiconductor in accordance with the present invention.
Figure 2:
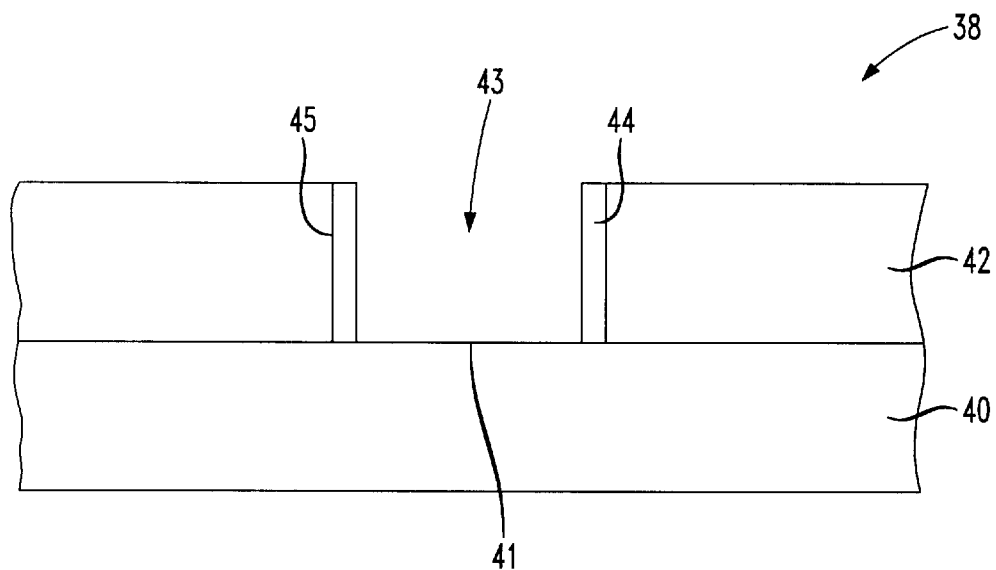
FIGS. 2–6 are cross-sectional views of a semiconductor device illustrating the formation thereof in accordance with the present invention.

Referring initially now to the flow chart of FIG. 1, the basic steps of the method that forms a semiconductor device of the present invention are now described. In accordance with the present invention, the method begins (Block 18) and a first dielectric layer is formed by normal techniques, such as epitaxial growth or chemical vapor deposition (CVD) (Block 20). A photoresist layer (not shown) is formed and patterned over the first dielectric layer using well known photolithography techniques to define the location where an opening is to be formed. Next, the exposed portions of the first dielectric layer are etched. At least one opening is etched in the first dielectric layer (Block 22). A second dielectric layer is formed on the sidewalls of the opening (Block 24). Then a barrier layer is deposited to line the opening (Block 26) and a conductive layer is deposited over the wafer to fill the opening (Block 28). The wafer is then subjected to chemical mechanical polishing (CMP) (Block 30) and a wet etch clean (Block 32) before ending the method (Block 34).

Referring to the cross-sectional views in FIGS. 2–6, a semiconductor device 38 including a second dielectric layer 44 are now described. The semiconductor substrate 40 is preferably silicon, or may be silicon or a polysilicon layer or structure formed on the substrate. A plurality of devices, such as transistors (not shown), are formed in the substrate 40 using well known techniques. The semiconductor device 38 includes a first dielectric layer 42 adjacent the substrate 40. The first dielectric layer is formed from any suitable dielectric, e.g., silicon dioxide, silicon nitride and/or any material or alloy of material having a desired dielectric constant. Other suitable materials include tantalum pentoxide and barium strontium titantate, for example, as long as the dielectric does not affect the formation of the second dielectric lining the vertical sidewalls of the opening for a conductive layer of the present invention.

The first dielectric layer 42 includes an opening 43 formed therein. The depth of the opening 43 is in a range of about 200 to 400 nm depending on the actual thickness of the first dielectric layer 42. Once the opening 43 has been formed, a second dielectric layer 44 is deposited or grown on the vertical sidewalls 45 thereof. The second dielectric layer 44 may be formed from any suitable dielectric which has different etch characteristics than the first dielectric layer 42. The second dielectric layer 44 preferably has a lower wet etch rate than the first dielectric layer 42. Suitable materials include silicon nitride, silicon oxy-nitride, silicon-rich-oxide, and high density silicon oxide. The thickness of the second dielectric 44 may be in a range of about 20 to 150 nm.

Figure 3:
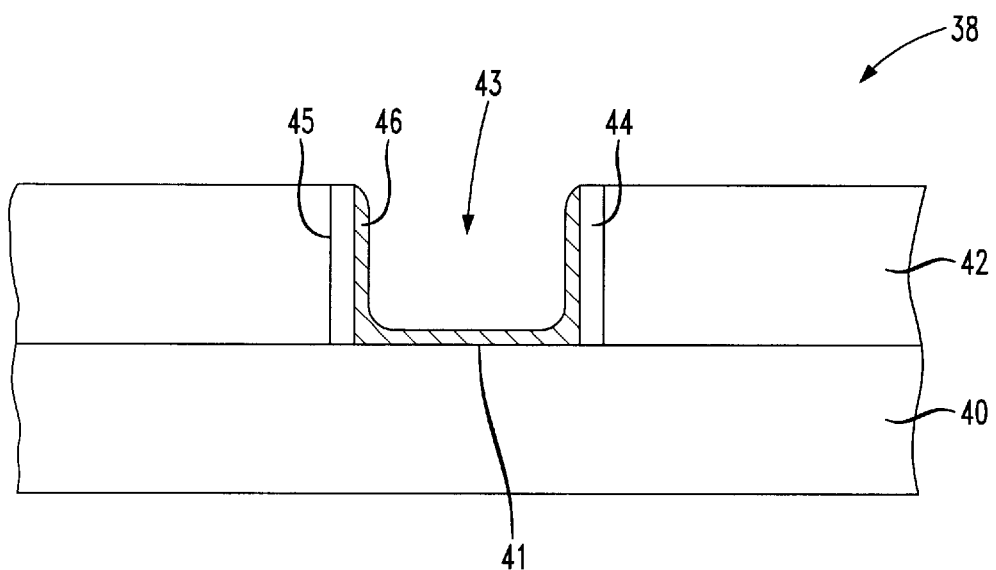
Figure 4:
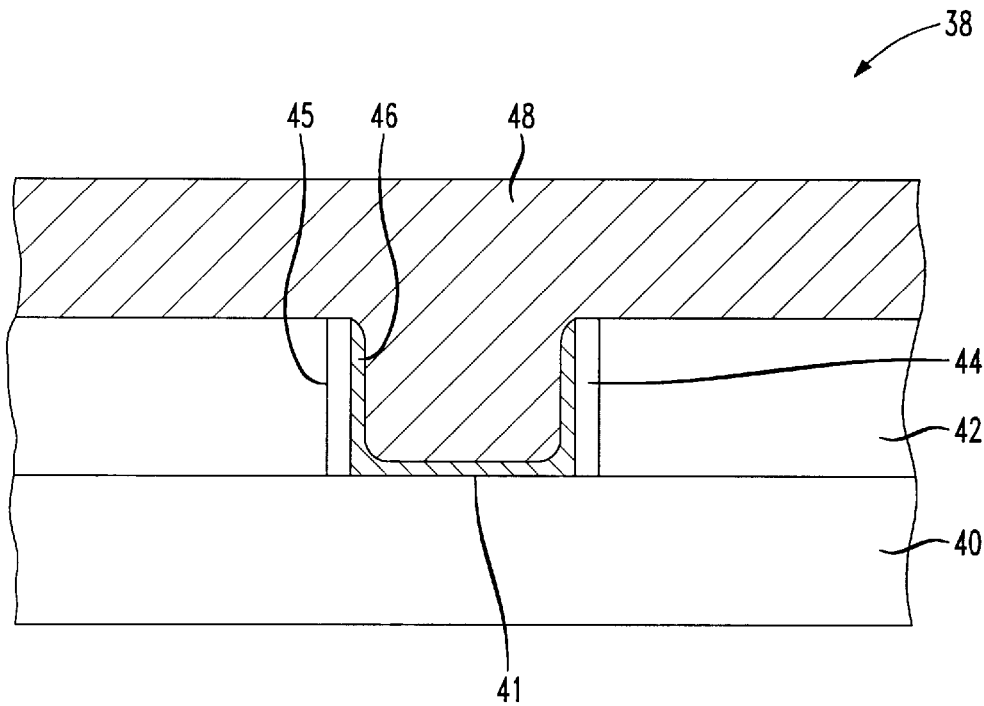
Figure 5:
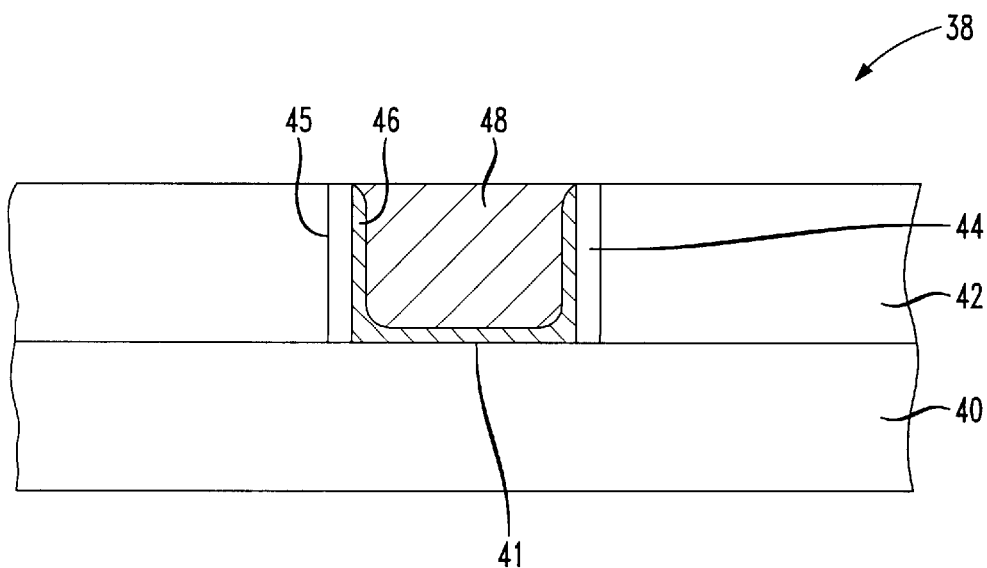
Figure 6:
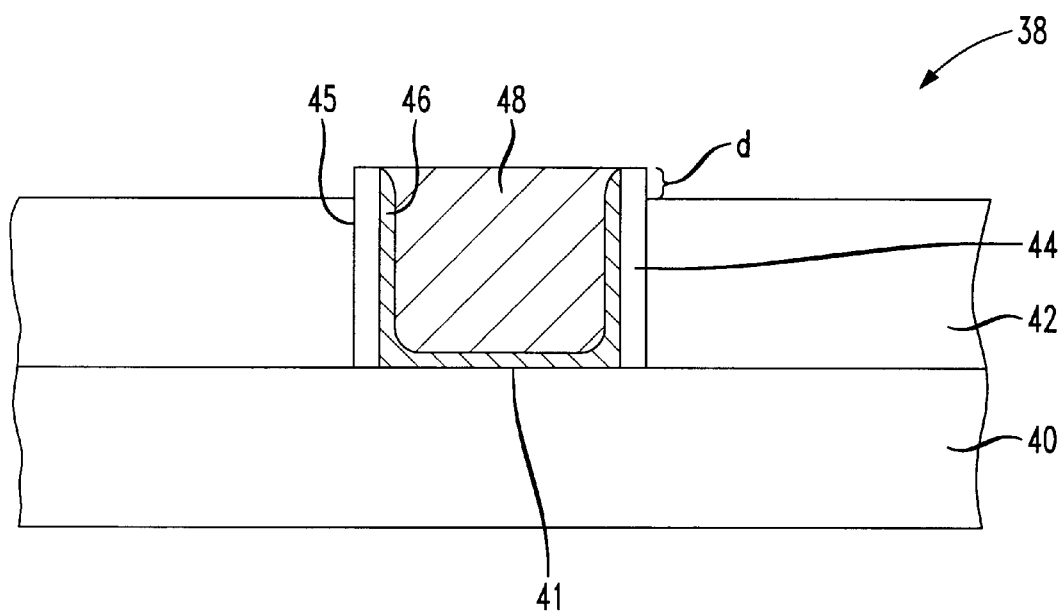

Furthermore, as shown in FIG. 3, a thin refractive metal barrier layer 46, such as tantalum, tantalum nitride, titanium or titanium nitride can be blanket deposited into the opening 43 using well known techniques such as sputtering. The barrier layer 46 lines the second dielectric layer 44 and the bottom 41 of the opening 43. A conductive material 48 is deposited on the surface of the first dielectric layer 42 and into the opening 43 until the opening is filled. For example, as shown in FIG. 4, a conductive layer 48, such as copper, is deposited at least over selected portions of the first dielectric layer 42, such that the copper layer 48 is deposited within the opening 43 and over at least portions of the first dielectric layer 42 adjacent the opening 43. As illustrated, the copper layer 48 can form a layer over the entire surface. Alternatively, only selected portions of the copper layer may be deposited. The copper layer 48 can be deposited by electrodeposition, electroplating or CVD techniques well known to those skilled in the art.

A chemical-mechanical polishing (CMP) technique may be used to etch back the barrier metal and any conductive material deposited on the first dielectric layer 43. Other well known etch back techniques can be used, such as reactive ion etching (RIE). The upper surface of the conductive layer 48 and the barrier layer 46 are then passivated. For example, the device 38 may be subjected to an anodic water bath to form a protective film and passivate the conductive layer 48 and the barrier layer 46.

Hydrofluoric acid (HF) is used in a cleaning step to remove metal and slurry particulates from the surface of the first dielectric layer 42. The Hydrofluoric acid chemically etches the surface of the first dielectric layer 42 and may result in a depth d difference between the upper surface of the conductive layer 48 and the upper surface of the first dielectric layer 42. Such a depth difference d may be in a range of 40–50 nm for a thirty second hydrofluoric acid cleaning step, for example. Such a depth difference d may result because the protected upper surface of the 10 conductive layer 48 and the barrier layer 46 are not susceptible to attack from the hydrofluoric acid.

Conventionally, without the second dielectric layer 44, the hydrofluoric acid may remove some of the barrier layer 46 at the upper portions of the sidewalls 45 of the opening 43. This would expose the conductive layer 48, such as copper, in the opening 43 causing localized corrosion.

In the present invention, during this hydrofluoric acid cleaning step, the second dielectric layer 44 protects the barrier layer 46 and the conductive layer 48 from being attacked by the hydrofluoric acid as the first dielectric layer 42 is etched down. The second dielectric layer 44 has a lower wet etch rate to ensure that the hydrofluoric acid does not attack the barrier layer 46 and the conductive layer 48 along upper portions of the sidewalls 45. Additionally, the second dielectric layer 44 on the sidewalls 45 ensures the integrity of the opening 43.

The thicknesses of the various layers may vary as would be appreciated by those skilled in the art. For example, the first dielectric layer 42 can be deposited over the substrate by chemical vapor deposition (CVD) from a TEOS source gas and could have a thickness of about 400 to 600 nm or greater. The appropriate second dielectric layer 44 can have a thickness between about 20 to 150 nm, for example. Naturally, this is only a range of thickness, which can vary depending on the thickness desired and the end use of the semiconductor devices.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A method of making a semiconductor device comprising the steps of:

forming a first dielectric layer adjacent a semiconductor substrate, having at least one opening therein, the at least one opening having vertical sidewalls and a bottom;

forming a second dielectric layer lining the vertical sidewalls of the at least one opening, the second dielectric layer having a relatively lower etch rate than the first dielectric layer;

depositing a barrier layer lining the second dielectric layer and the bottom of the at least one opening;

depositing a conductive layer on the barrier layer and filling the at least one opening;

chemically mechanically polishing the conductive layer; and cleaning an upper surface of the first dielectric layer with the second dielectric layer protecting upper edges of the barrier layer and conductive layer.

2. A method according to claim 1, wherein the first dielectric layer comprises silicon oxide.

3. A method according to claim 2, wherein the second dielectric layer comprises at least one of silicon nitride, silicon oxy-nitride, silicon-rich-oxide, and high density silicon oxide.

4. A method according to claim 1, wherein the second dielectric layer comprises at least one of silicon nitride, silicon oxy-nitride, silicon-rich-oxide and high density silicon oxide.

5. A method according to claim 1, wherein the conductive layer comprises copper.

6. A method according to claim 1, wherein the barrier layer comprises a refractory metal.

7. A method according to claim 1, wherein the relatively lower etch rate of the second dielectric layer is a relatively lower wet etch rate, and wherein the step of cleaning the upper surface of the semiconductor wafer comprises a wet etch.

8. A method according to claim 1, wherein the relatively lower etch rate of the second dielectric layer is based on a wet etch in hydrofluoric acid and, wherein the step of cleaning the upper surface of the semiconductor wafer comprises a wet etch in hydrofluoric acid.

9. A method according to claim 1, wherein the second dielectric layer is formed to have a thickness in the range of 20–150 nm.

10. A method of making a semiconductor device comprising the steps of:
   forming a semiconductor wafer including a first dielectric layer, having at least one opening therein, adjacent a semiconductor substrate, the at least one opening having vertical sidewalls and a bottom;
   forming a second dielectric layer lining at least an uppermost portion of the vertical sidewalls of the at least one opening, the second dielectric layer having a relatively lower etch rate than the first dielectric layer;
   forming a conductive layer filling the at least one opening; and
   cleaning an upper surface of the semiconductor wafer with the second dielectric layer protecting upper edges of the conductive layer.

11. A method according to claim 10, further comprising the step of forming a barrier layer lining the at least one opening prior to the step of forming the conductive layer.

12. A method according to claim 10, further comprising the step of chemically mechanically polishing the upper surface of the semiconductor wafer prior to the step of cleaning the upper surface.

13. A method according to claim 10, wherein the first dielectric layer comprises silicon oxide.

14. A method according to claim 13, wherein the second dielectric layer comprises at least one of silicon nitride, silicon oxy-nitride, silicon-rich-oxide, and high density silicon oxide.

15. A method according to claim 10, wherein the second dielectric layer comprises at least one of silicon nitride, silicon oxy-nitride, silicon-rich-oxide, and high density silicon oxide.

16. A method according to claim 10, wherein the conductive layer comprises copper.

17. A method according to claim 10, wherein he barrier layer comprises a refractory metal.

18. A method according to claim 10, wherein the relatively lower etch rate of the second dielectric layer is a relatively lower wet etch rate, and wherein the step of cleaning the upper surface of the semiconductor wafer comprises a wet etch.

19. A method according to claim 10, wherein the relatively lower etch rate of the second dielectric layer is based on a wet etch in hydrofluoric acid, and wherein the step of cleaning the upper surface of the semiconductor wafer comprises a wet etch in hydrofluoric acid.

20. A method according to claim 10, wherein the second dielectric layer is formed to have a thickness in the range of 20–150 nm.

21. A method of making a semiconductor device comprising the steps of:
   forming a silicon oxide dielectric layer adjacent a semiconductor substrate;
   etching at least one opening in the silicon oxide dielectric layer, the at least one opening having vertical sidewalls and a bottom;
   forming a second dielectric layer lining at least an uppermost portion of the vertical sidewalls of the at least one opening, the second dielectric layer having a relatively lower etch rate than the silicon oxide dielectric layer;
   depositing a refractory metal barrier layer lining the at least one opening;
   depositing a copper layer filling the at least one opening;
   chemically mechanically polishing an upper surface of the semiconductor wafer; and
   cleaning the upper surface of the semiconductor wafer with the second dielectric layer protecting upper edges of the barrier layer and conductive layer.

22. A method according to claim 21, wherein the second dielectric layer comprises at least one of silicon nitride, silicon oxy-nitride, silicon-rich-oxide, and high density silicon oxide.

23. A method according to claim 21, wherein the relatively lower etch rate of the second dielectric layer is a relatively lower wet etch rate, and wherein the step of cleaning the upper surface of the semiconductor wafer comprises a wet etch.

24. A method according to claim 21, wherein the relatively lower etch rate of the second dielectric layer is based on a wet etch in hydrofluoric acid, and wherein the step of cleaning the upper surface of the semiconductor wafer comprises a wet etch in hydrofluoric acid.

25. A method according to claim 21, wherein the second dielectric layer is formed to have a thickness in the range of 20–150 nm.

* * * * *